US008824623B2

(12) United States Patent
Takemura et al.

(10) Patent No.: US 8,824,623 B2
(45) Date of Patent: Sep. 2, 2014

(54) TIMER DEVICE AND ELECTRONIC APPARATUS

(71) Applicant: Seiko Epson Corporation, Tokyo (JP)

(72) Inventors: Makoto Takemura, Kamiina-gun (JP); Toru Shirotori, Kamiina-gun (JP)

(73) Assignee: Seiko Epson Corporation, Tokyo (JP)

( * ) Notice: Subject to any disclaimer, the term of this patent is extended or adjusted under 35 U.S.C. 154(b) by 25 days.

(21) Appl. No.: 13/691,182

(22) Filed: Nov. 30, 2012

(65) Prior Publication Data

US 2013/0142299 A1 Jun. 6, 2013

(30) Foreign Application Priority Data

Dec. 5, 2011 (JP) ................................. 2011-266124

(51) Int. Cl.
*H03K 21/38* (2006.01)
*G04F 3/06* (2006.01)
*G04F 10/00* (2006.01)

(52) U.S. Cl.
CPC . *G04F 10/00* (2013.01); *G04F 3/06* (2013.01)
USPC ............................ 377/107; 377/111; 377/112

(58) Field of Classification Search
None
See application file for complete search history.

(56) References Cited

U.S. PATENT DOCUMENTS 3,633,114 A * 1/1972 Patel ............................ 377/107
4,239,957 A * 12/1980 Satoh et al. ..................... 377/45
4,330,751 A * 5/1982 Swain ........................... 327/114
4,443,887 A * 4/1984 Shiramizu ...................... 377/110
4,741,004 A * 4/1988 Kane ............................ 377/110
5,157,699 A 10/1992 Miyazaki et al.
5,239,319 A 8/1993 Miyazaki et al.
5,248,904 A 9/1993 Miyazaki et al.
5,457,722 A * 10/1995 Chahabadi ...................... 377/47
5,526,391 A * 6/1996 Shankar et al. ................. 377/47
8,644,447 B2 * 2/2014 Prakash et al. .................. 377/47

FOREIGN PATENT DOCUMENTS

JP A-3-250226 11/1991
JP A-4-256038 9/1992
JP A-7-200329 8/1995

* cited by examiner

*Primary Examiner* — Tuan T Lam
(74) *Attorney, Agent, or Firm* — Oliff PLC

(57) ABSTRACT

A timer device includes a RES input terminal, an OUT output terminal, a delay circuit that delays a signal input to the RES input terminal, and a pre-settable down counter that counts a given set value, and outputs a measurement completion signal via an output terminal when the counting of the set value is completed. When a predetermined signal is input to an input terminal after an output of the measurement completion signal, the pre-settable down counter completes the output of the measurement completion signal based on a delay signal obtained by the delaying the predetermined signal using the delay circuit.

7 Claims, 8 Drawing Sheets

TIMER DEVICE AND ELECTRONIC APPARATUS

BACKGROUND

1. Technical Field

The present invention relates to a timer device and an electronic apparatus.

2. Related Art

A timer IC (Integrated Circuit) is an IC that measures time set in advance and outputs measurement completion signals when the measurement is completed, and used for various applications. A system can be configured in which, when, for example, a CPU (Central Processing Unit) is set to be in asleep mode in order to reduce power consumption and then, after a predetermined time elapses, a predetermined calculation process has to be performed by activating the CPU, a measurement completion signal output by a timer IC after measuring the predetermined time is input to the CPU as an interrupt signal, the CPU receives the interrupt signal, and accordingly the predetermined calculation process is performed.

JP-A-3-250226 is an example of the related art.

Two methods are considered as a method of setting a measurement time of the timer IC. One setting method is to write a set value of a measurement time in an internal register via an external terminal for a serial interface (a serial clock terminal, a serial data terminal, or the like) of a timer IC, and the other setting method is to set a measurement time directly in a plurality of external terminals of a timer IC. The former setting method may use a small number of terminals for setting the timer IC and is advantageous in terms of low cost since an inexpensive package can be selected. However, when the timer IC is mounted in a vehicle, for example, the device is required to have high reliability, but due to an effect of noise resulting from an engine, or the like, or due to a bug in a program used to write a set value, there is a concern that an incorrect set value will be written, which may impair the reliability thereof. Therefore, when high reliability is required, the latter setting method is effective, but a number of terminals for setting of the timer IC have to be secured. For this reason, when low cost is required, it is necessary to reduce the number of terminals other than terminals for setting to be as low as possible so as to use an inexpensive package.

On the other hand, as methods of using a timer IC, a single mode in which measurement is performed only once and a repeat mode in which measurement is repeatedly performed in a fixed cycle are considered, and thus, a timer IC that can correspond to both the single mode and the repeat mode is required. In order to correspond to the requirement, a dedicated external terminal for selecting a single mode or a repeat mode may be provided in a timer IC, but as described above, there are cases in which there are no terminals to spare, or in which it is difficult to assign a dedicated external terminal.

SUMMARY

An advantage of some aspects of the invention is to provide a timer device and an electronic apparatus which enable selection of a single mode and a repeat mode without providing a dedicated external terminal.

The invention can be implemented as the following forms or application examples.

Application Example 1

This application example is directed to a timer device including: a first external terminal; a second external terminal; a delay circuit that delays a signal input to the first external terminal; and a counting circuit that counts a given set value, and when counting of the set value is completed, outputs a measurement completion signal via the second external terminal, and when a predetermined signal is input to the first external terminal after an output of the measurement completion signal, the counting circuit completes the output of the measurement completion signal based on a signal obtained by delaying the predetermined signal by the delay circuit.

The set value may be a fixed value that is decided in advance, or may be variable.

The predetermined signal may be, for example a signal having a continuous low level, or a signal having a continuous high level.

According to this timer device, since the measurement completion signal is output when the counting circuit completes counting of the set value, a single mode can be realized. In addition, according to the timer device, since an output of the measurement completion signal is completed by inputting a predetermined signal to the first external terminal, by inputting the predetermined signal in synchronization with the measurement completion signal, a repeat mode in which the measurement completion signal is cyclically output can be realized. In other words, by connecting the first external terminal and the second external terminal in a direct manner or via a given circuit or disconnecting the terminals, any one of the repeat mode and the single mode can be selected even without providing a dedicated external terminal.

In addition, according to the timer device, even when a predetermined signal is input to the first external terminal at the same time as an output of the measurement completion signal is started, since the output of the measurement completion signal is completed based on a signal obtained by delaying the predetermined signal using the delay circuit, an output time of the measurement completion signal can be sufficiently secured according to the delay time of the delay circuit. In other words, even in the repeat mode, an external device such as a CPU can reliably recognize the measurement completion signal.

Application Example 2

In the timer device according to the above-described Application Example 1, the counting circuit may newly count the set value every time counting of the set value is completed.

In this configuration, by inputting a predetermined signal to the first external terminal in synchronization with a measurement completion signal output from the second external terminal, it is possible to make the timer device repeatedly output measurement completion signals on a fixed cycle.

Application Example 3

The timer device according to the above-described application example may further include an input time determination circuit that determines the time length relationship between an input time of the predetermined signal and a given determination time based on a signal obtained by delaying the predetermined signal by the delay circuit and input to the first external terminal using the delay circuit, and the counting circuit may select whether or not a count value is to be initialized according to the determination result of the input time determination circuit.

In this configuration, by changing the input time of the predetermined signal input to the first external terminal, it is possible to select whether or not a count value of the counting circuit is to be initialized without providing a dedicated external terminal.

It may be configured that, for example, the delay time of the delay circuit is set to be shorter than the determination time, and when the input time of the predetermined signal is longer than the determination time, the counting circuit initializes a count value, and when the input time of the predetermined signal is shorter than the determination time, the counting circuit does not initializes the count value.

In this configuration, when the predetermined signal is input to the first external terminal in synchronization with the measurement completion signal output from the second external terminal, the count value of the counting circuit may set not to be initialized.

Application Example 4

The timer device according to the above-described application example may further include third to n-th (n≥3) external terminals, and the counting circuit includes a buffer in which the set value is stored, and selects whether or not the set value stored in the buffer is to be updated to a set value according to a signal input to the third to n-th external terminals in accordance with the determination result of the input time determination circuit.

In this configuration, by changing the input time of the predetermined signal input to the first external terminal, it is possible to select whether or not the set value of the counting circuit is to be updated to a set value according to a signal input to the third to n-th external terminals. Thus, since it is not necessary to change the set value of the counting circuit using a program, reliability can be enhanced.

When, for example, the delay time of the delay circuit is set to be shorter than the determination time, the counting circuit includes the buffer storing a set value, and the input time of the predetermined signal is longer than the determination time, the set value stored in the buffer may be updated to a set value according to a signal input to the third to n-th external terminals.

In this configuration, when the predetermined signal is input to the first external terminal in synchronization with the measurement completion signal output from the second external terminal, the set value stored in the buffer may not be updated.

Application Example 5

In the timer device according to the above-described application example, by setting the time of a predetermined cycle of a first clock signal as the determination time, the input time determination circuit may determine the time length relationship between the input time of the predetermined signal and the determination time.

In this configuration, by counting the number of first clock signals in the input time of the predetermined signal, the time length relationship between the input time of the predetermined signal and the determination time can be easily determined.

Application Example 6

The timer device according to the above-described application example may further include (n+1)-th to m-th (m≥n+1) external terminals, and the counting circuit may set to count the set value based on a second clock signal of a frequency according to a signal input to the (n+1)-th to m-th external terminals.

In this configuration, since a measurement time of the timer device is decided according to the product of the cycle of the second clock signal and the set value, the range of selecting the measurement time can be widened by setting the frequency of the second clock signal to be variable.

Application Example 7

This application example is directed to an electronic apparatus that includes the timer device according to any one of the application examples described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described with reference to drawings. Note that the embodiment described below does not unduly limit the content of the invention described in the appended claims. In addition, the entire constituent elements described below are not necessarily essential constituent elements of the invention.

1. Timer Device 1-1. Configuration and Function of a Timer Device

Figure 1:
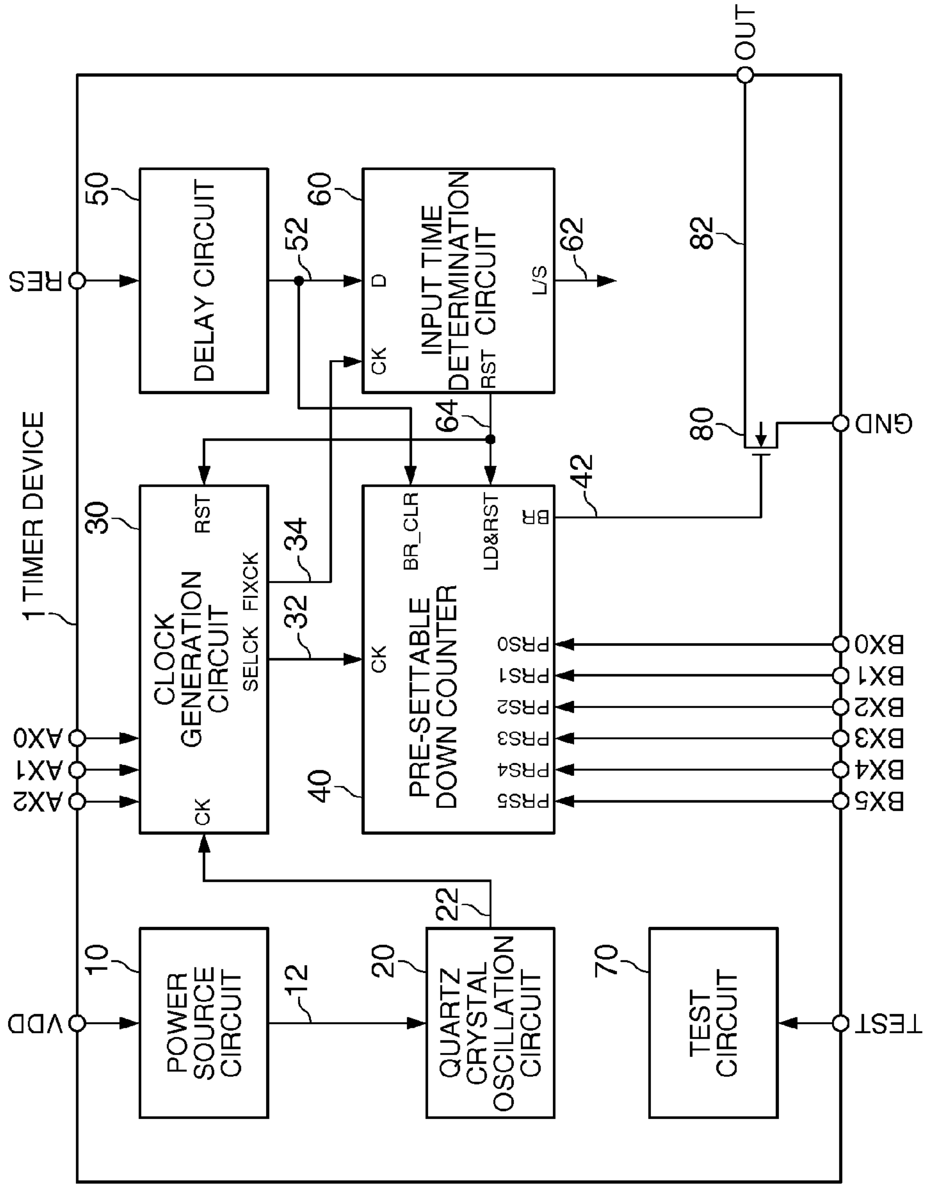
FIG. 1 is a diagram showing a configuration example of a timer device according to the present embodiment.

FIG. 1 is a diagram showing a configuration example of a timer device according to the present embodiment. The timer device 1 according to the embodiment is configured to include a power source circuit 10, a quartz crystal oscillation circuit 20, a clock generation circuit 30, a pre-settable down counter 40, a delay circuit 50, an input time determination circuit 60, a test circuit 70, and an NMOS transistor 80. In addition, the timer device 1 of the embodiment is provided with 14 external terminals (a VDD terminal, an AX2 input terminal, an AX1 input terminal, an AX0 input terminal, a RES input terminal, a TEST input terminal, a BX5 input terminal, a BX4 input terminal, a BX3 input terminal, a BX2 input terminal, a BX1 input terminal, a BX0 input terminal, a GND terminal, and an OUT output terminal). However, the timer device 1 of the embodiment may be configured such that some of the elements thereof is omitted or changed, or other elements are added thereto.

The power source circuit 10 generates a power source voltage 12 of the quartz crystal oscillation circuit 20 and a power source voltage of other circuits by turning a power source voltage supplied from the VDD terminal into a low voltage.

The quartz crystal oscillation circuit 20 is configured to have a quartz crystal vibrator and an oscillation circuit not shown in the drawing, and generates an original oscillation clock signal 22 oscillating at a predetermined frequency (for example, 32.768 kHz) according to a resonance frequency of the quartz crystal vibrator.

The clock generation circuit 30 generates a plurality of frequency division signals obtained by dividing the original oscillation clock signal 22, and outputs a selected clock signal 32 by selecting one clock signal according to the voltage of the AX2 input terminal, the AX1 input terminal, the AX0 input terminal among the original oscillation clock signal 22 and the plurality of frequency division signals. In addition, the clock generation circuit 30 outputs one clock signal decided in advance out of the original oscillation clock signal 22 and the plurality of frequency division signals as a fixed clock signal 34.

Figure 2:
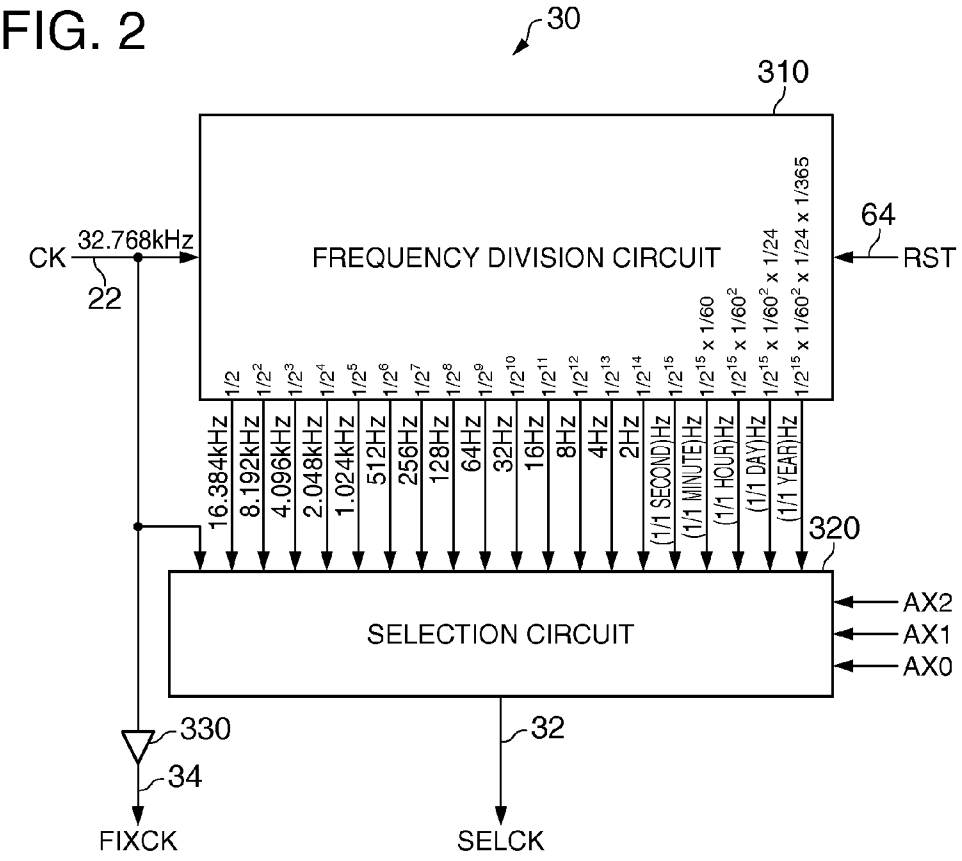
FIG. 2 is a diagram showing a configuration example of a clock generation circuit.

FIG. 2 is a diagram showing a configuration example of the clock generation circuit 30. The clock generation circuit 30 shown in FIG. 2 is configured to include a frequency division circuit 310, a selection circuit 320, and a buffer cell 330.

The frequency division circuit 310 generates clock signals by dividing the frequency of the original oscillation clock signal 22 (32.768 kHz) by 2, 4 ($=2^2$), 8 ($=2^3$), 16 ($=2^4$), 32 ($=2^5$), 64 ($=2^6$), 128 ($=2^7$), 256 ($=2^8$), 512 (=29), 1024 ($=2^{10}$), 2048 ($=2^{11}$), 4096 ($=2^{12}$), 8192 ($=2^{13}$), 16384 ($=2^{14}$), and 32768 ($=2^{15}$). The frequency-divided clock signals can be simply generated by configuring a ripple-carry-type frequency division circuit using 15 flip-flops. Note that one cycle of a clock signal obtained by dividing the original oscillation clock signal 22 of 32.768 kHz by 32768 is equivalent to one second.

Further, the frequency division circuit 310 generates clock signals obtained by dividing the frequency of a clock signal of which one cycle is equivalent to one second (frequency-divided-by-32768 clock signal) by 60 (of which one cycle is equivalent to one minute), a clock signal obtained by dividing the frequency of a clock signal of which one cycle is equivalent to one minute by 60 (of which one cycle is equivalent to one hour), a clock signal obtained by dividing the frequency of a clock signal of which one cycle is equivalent to one hour by 24 (of which one cycle is equivalent to one day), and a clock signal obtained by dividing a clock signal of which one cycle is equivalent to one day by 365 (of which one cycle is equivalent to one year).

The selection circuit 320 selects, in accordance with signals (voltages) input from the AX2 input germinal, AX1 input terminal, and AX0 input terminal, one clock signal from 8 kinds of clock signals (for example, a frequency-divided-by-2 clock signal, a frequency-divided-by-8 clock signal, a frequency-divided-by-128 clock signal, a frequency-divided-by-512 clock signal, a one-second clock signal, a one-minute clock signal, a one-hour clock signal, and a one-day clock signal) that are decided in advance from a design stage among the 19 kinds of frequency-divided clock signals generated from the original oscillation clock signal 22 and the frequency division circuit 310 so as to output the signal as a selected clock signal 32.

In addition, the clock generation circuit 30 shown in FIG. 2 outputs the original oscillation clock signal 22 via the buffer cell 330 as a fixed clock signal 34.

Note that the frequency division circuit 310 is reset by a reset signal 64 (low active), and accordingly, the phase of the selected clock signal 32 is initialized.

Returning to FIG. 1, after a preset value that is set is initialized, the pre-settable down counter 40 performs down-counting in synchronization with the selected clock signal 32, and outputs a borrow signal (borrow signal) 42 of a high level when a count value becomes 0.

Figure 3:
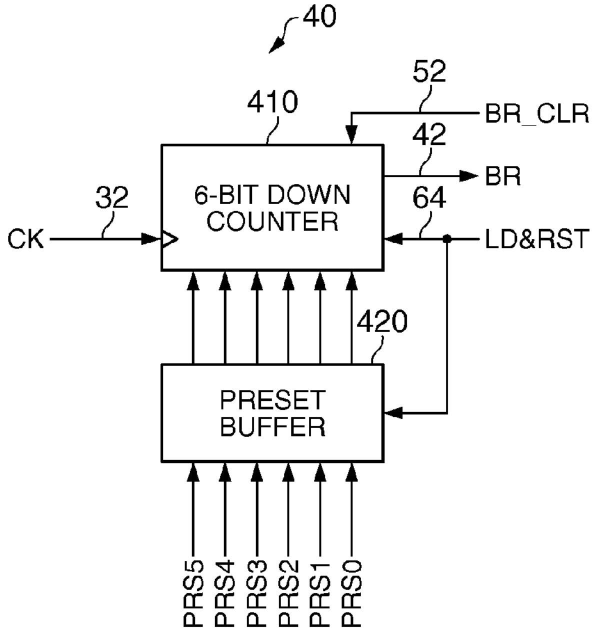
FIG. 3 is a diagram showing a configuration example of a pre-settable down counter.

FIG. 3 is a diagram showing a configuration example of the pre-settable down counter 40. The pre-settable down counter 40 shown in FIG. 3 is configured to include a 6-bit down counter 410 and a preset buffer 420.

The 6-bit down counter 410 performs down-counting in synchronization with the leading edge of the selected clock signal 32 after a 6-bit preset value stored in the preset buffer 420 is asynchronously set using the reset signal 64 (low active), and then the reset signal 64 is released. Then, the 6-bit down counter 410 outputs the borrow signal 42 of a high level when a count value turns from 1 to 0. This borrow signal 42 maintains to be in the high level without being cleared until a delay signal 52 of a low level is input. Then, 6-bit down counter 410 performs down-counting again after the 6-bit preset value is asynchronously set which is stored in the preset buffer 420 in synchronization with the leading edge of a next selected clock signal 32 after the count value becomes 0. In other words, the 6-bit down counter 410 repeatedly performs down-counting from a preset value to 0 on a fixed cycle if the reset signal 64 is in a high level, or compulsorily initializes the count value to be a preset value if the reset signal 64 is in a low level.

The preset buffer 420 is asynchronously loaded with signals (voltages) input from the BX5 input terminal, BX4 input terminal, BX3 input terminal, BX2 input terminal, BX1 input terminal, and BX0 input terminal using the reset signal 64 (low active) so as to store the 6-bit preset value.

Accordingly, when the reset signal 64 is in the low level, the preset buffer 420 is updated to have the preset value set in the input terminals from BX5 to BX0, and the 6-bit down counter 410 is initialized to have the updated preset value (that is, the preset value set in the input terminals from BX5 to BX0) stored in the preset buffer 420. Then, after the reset signal 64 is in the high level, the 6-bit down counter 410 performs down-counting.

Returning to FIG. 1, the delay circuit 50 outputs the delay signal 52 obtained by delaying a signal input from the RES input terminal by a predetermined time (for example, 100 ns). The delay circuit 50 may be configured, for example, to include a plurality of buffer cells which are connected in series, or to be a CR circuit using resistors and capacitors.

The input time determination circuit 60 determines the time length relationship between the input time of the signal input from the RES input terminal and a predetermined determination time on the basis of the delay signal 52. Particularly, the input time determination circuit 60 in the embodiment determines whether the input time of the signal in a low level input from the RES input terminal is longer or shorter than the determination time by comparing the time of the low level of the delay signal 52 to the time of one cycle of the fixed clock signal 34 (the time of one cycle is equivalent to the determination time).

Figure 4:
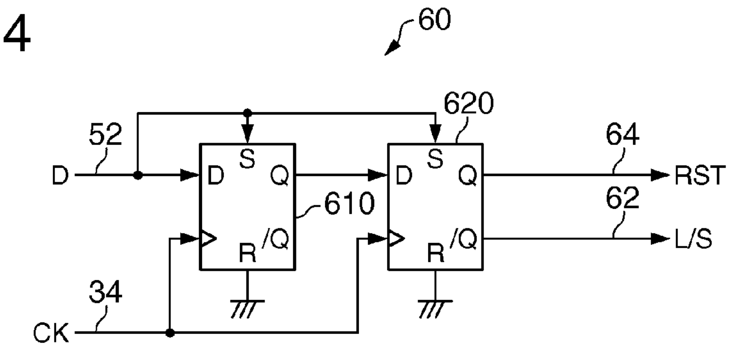
FIG. 4 is a diagram showing a configuration example of an input time determination circuit.

FIG. 4 is a diagram showing a configuration example of the input time determination circuit 60. The input time determination circuit 60 shown in FIG. 4 is configured to include two D flip-flops 610 and 620 having functions of asynchronous setting and asynchronous resetting.

In the D flip-flop 610, the delay signal 52 is input to a data input terminal (D) and an asynchronous set input terminal (S), the fixed clock signal 34 is input to a clock input terminal, and an asynchronous reset input terminal (R) is grounded.

In the D flip-flop 620, a data input terminal (D) is connected to a data output terminal (Q) of the D flip-flop 610, the fixed clock signal 34 is input to a clock input terminal, the delay signal 52 is input to an asynchronous set input terminal (S), and an asynchronous reset input terminal (R) is grounded.

A signal output from the data output terminal (Q) of the D flip-flop 620 is supplied to the clock generation circuit 30 and the pre-settable down counter 40 as the reset signal 64. In addition, a signal output from an inverse data output terminal (/Q) of the D flip-flop 620 is an input time determination signal 62.

Returning to FIG. 1, the test circuit 70 is a circuit for performing tests of each circuit, and for example, can perform a test of an output value by accelerating a counting operation of the pre-settable down counter 40.

With regard to the NMOS transistor 80, a borrow signal 42 is input to a gate terminal thereof, a source terminal thereof is grounded via a GND terminal, and a drain terminal thereof is connected to an OUT output terminal. Thus, when the pre-settable down counter 40 performs down-counting to 0, and the borrow signal 42 is changed from a low level to a high level, the NMOS transistor 80 is switched from an off state to an on state, and the drain terminal is changed from a high impedance state to a low impedance state. A signal output from the drain terminal of the NMOS transistor 80 is output from the OUT output terminal to outside as the measurement completion signal 82. Thus, the OUT output terminal is an open drain output terminal that is in a high impedance state in normal times, but becomes a low impedance state when the pre-settable down counter 40 counts the preset value that is set in advance (in other words, when the timer device 1 measures a set time), and is pulled up to a power source voltage outside the timer device 1.

Note that the pre-settable down counter 40, the delay circuit 50, and the input time determination circuit 60 in FIG. 1 respectively correspond to the "count circuit", the "delay circuit", and the "input time determination circuit" according to the invention. In addition, the preset buffer 420 corresponds to the "buffer" according to the invention. In addition, the RES input terminal and the OUT output terminal respectively correspond to the "first external terminal" and the "second external terminal" according to the invention, BX0 to BX5 input terminals correspond to the "third to n-th external terminals" (in a case in which n=8) according to the invention, and AX0 to AX2 input terminals correspond to the "n+1 to m-th external terminals" (in a case in which n=8 and m=11). In addition, the fixed clock signal 34 and the selected clock signal 32 respectively correspond to the "first clock signal" and the "second clock signal" according to the invention. Further, a signal in a low level input from the RES input terminal is an example of the "predetermined signal input to the first external terminal" according to the invention.

1-2. External Connection Method of Timer Device

As shown in FIG. 1, the timer device 1 of the embodiment uses 14 external terminals, and fully uses all pins if a 14-pin package is installed therein. For this reason, it is not possible to assign an external terminal for selecting any one of the single mode in which the pre-settable down counter 40 counts a set count value once (the timer device 1 measures a set time once) and the repeat mode in which the pre-settable down counter 40 repeatedly counts a set count value on a fixed cycle (the timer device 1 repeatedly measures a set time on a fixed cycle). Thus, the timer device 1 of the embodiment of the invention is designed to realize the single mode by inputting a start signal from outside to the RES input terminal, and to realize the repeat mode by connecting the RES input terminal and the OUT output terminal.

Figure 5:
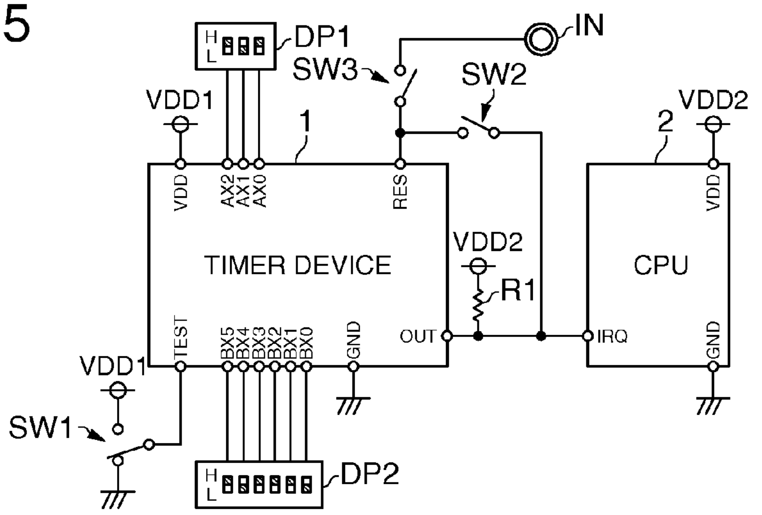
FIG. 5 is a diagram showing an external connection example of the timer device according to the embodiment.

FIG. 5 is a diagram showing an external connection example of the timer device 1 according to the embodiment. In the example of FIG. 5, a power source voltage VDD1 is supplied to a VDD terminal of the timer device 1, and a GND terminal is grounded. In addition, a TEST terminal of the timer device 1 is grounded during normal operations, and the power source voltage VDD1 is supplied thereto during a test operation, due to switch setting of a mechanical-type switch SW1.

The AX2, AX1, and AX0 terminals of the timer device 1 are connected to a dip switch DP1 so as to input 3-bit data in accordance with switch setting of the dip switch DP1. In the same manner, the BX5, BX4, BX3, BX2, BX1, and BX0 terminals of the timer device 1 are connected to a dip switch DP2 so as to input 6-bit data in accordance with switch setting of the dip switch DP2.

The OUT output terminal of the timer device 1 is connected to an IRQ input terminal (an interrupt input terminal of a low active state) of a CPU 2, and pulled up to a power source voltage VDD2 (the same power source voltage as that of the CPU 2) via a pull-up resistor R1. Further, the RES input terminal of the timer device 1 is connected to the OUT output terminal via a mechanical-type switch SW2, and is also connected to an input terminal IN via a mechanical-type switch SW3.

In this connection, the timer device 1 can be operated in the single mode by turning the switch SW2 off (disconnected) and the switch SW3 on (connected). In other words, when a start signal in a low level which indicates start of measurement is input from the input terminal IN, this start signal is input to the RES input terminal of the timer device 1 to make the timer device 1 start the measurement of a set time, and when the measurement is completed, the measurement completion signal 82 of a low level is output from the OUT output terminal. Accordingly, the OUT output terminal of the timer device 1 (in other words, the IRQ input terminal of the CPU 2) turns into a low level from a high level, and the CPU 2 performs a necessary interrupt process. When a new start signal is input from the input terminal IN, the timer device 1 finishes output of the measurement completion signal 82 (interrupt signal) and then performs measurement of a set time, and outputs a new measurement completion signal 82 (interrupt signal).

In this manner, it is possible to realize the single mode in which the measurement completion signal 82 (interrupt signal) of one time is generated for a start signal of one time.

On the other hand, the timer device 1 can be operated in the repeat mode in such a way that the switch SW2 is turned off (disconnected) and the switch SW3 is turned on (connected) and after the timer device 1 is caused to start measurement of a set time, the switch SW2 is turned on (connected) and the switch SW3 is turned off (disconnected). In other words, when a start signal indicating start of measurement is input from the input terminal IN by turning the switch SW2 off (disconnected) and turning the switch SW3 on (connected), this start signal is input to the RES input terminal of the timer device 1, and accordingly, the timer device 1 starts the measurement of the set time. Then, the switch SW2 is turned on (connected) and the switch SW3 is turned off (disconnected). When the timer device 1 finishes the measurement, a measurement completion signal 82 of a low level is output from the OUT output terminal, and thus, the CPU 2 performs a necessary interrupt process. At this moment, since the switch SW2 is turned on (connected), and the switch SW3 is turned off (disconnected), the measurement completion signal 82 output from the OUT output terminal of the timer device 1 is input to the RES input terminal as a restart signal. Using this restart signal, the output of the measurement completion signal 82 (interrupt signal) ends. However, since the input time of the restart signal is short, the reset signal 64 is not generated, and the 6-bit down counter 410 continues down-counting in synchronization with the leading edge of the selected clock signal 32. Then, when the timer device 1 finishes second measurement, the measurement completion signal 82 is output again from the OUT output terminal, and thus, the CPU 2 performs a necessary interrupt process again. Thereafter, in the same manner, every time the measurement completion signal 82 is output from the OUT output terminal of the timer device 1, a signal is input to the RES input terminal as a next restart signal to finish the output of the measurement completion signal 82, and then the timer device 1 repeats measurement of the set time on a fixed cycle.

In this manner, it is possible to realize the repeat mode in which the measurement completion signal 82 (the interrupt signal of the CPU 2) is repeatedly generated on a fixed cycle for a start signal of one time.

Note that, regardless of the single mode and the repeat mode, the switch SW3 may set to be on (connected) at all times, or the RES input terminal of the timer device 1 may be connected to the input terminal IN, removing the switch SW3. In addition, it may be possible that a 2-input AND circuit is provided instead of the switch SW3 to connect one input terminal of the 2-input AND circuit to the input terminal IN, to connect the other input terminal of the 2-input AND circuit to a terminal of the switch SW2 (the terminal on the side not connected to the OUT output terminal of the timer device 1), and to connect an output terminal of the 2-input AND circuit to the RES input terminal of the timer device 1.

In this manner, by fixing the switch SW2 to be off or on, it is possible to select any one of the single mode and the repeat mode without performing switch control. Note that, when the repeat mode is selected while the switch SW2 is turned on, only a first start signal is input from the input terminal IN.

Figure 6:
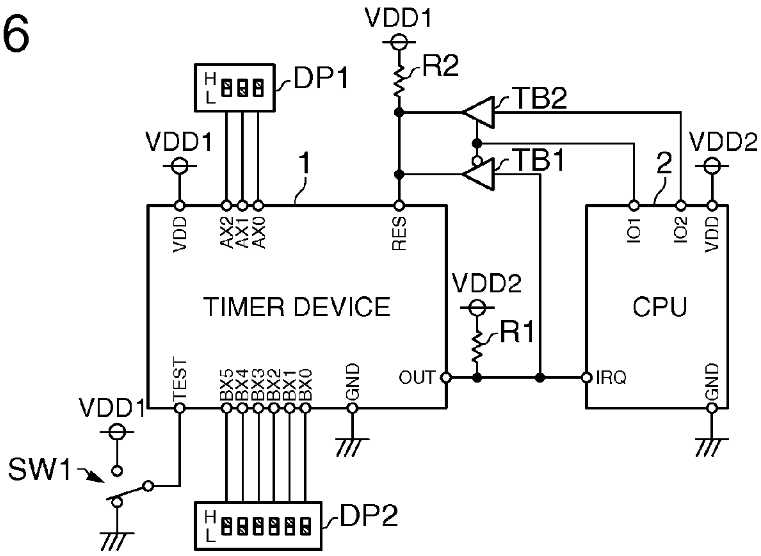
FIG. 6 is a diagram showing another external connection example of the timer device according to the embodiment.

FIG. 6 is a diagram showing another example of external connection of the timer device 1 according to the embodiment. In comparison to the example of FIG. 5, the external connection example of FIG. 6 has a different connection method of the RES input terminal and the OUT output terminal of the timer device 1. Connection of other external terminals of the timer device 1 in FIG. 6 is the same as that in FIG. 5, and therefore, description thereof is omitted.

In the example of FIG. 6, the RES input terminal of the timer device 1 is connected to the OUT output terminal via a tristate buffer TB1, and connected to an I/O port IO2 of the CPU 2 via a tristate buffer TB2. In addition, the RES input terminal of the timer device 1 is pulled up to the power source voltage VDD1 via a pull-up resistor R2.

With regard to the tristate buffer TB1, a control input terminal (low active) is connected to an I/O port IO1 of the CPU 2, and functions as a buffer when the I/O port IO1 is in a low level, and a data output terminal becomes in a high impedance state when the I/O port IO1 is in a high level. In addition, with regard to the tristate buffer TB2, a control input terminal (high active) is connected to the I/O port IO1 of the CPU 2, and functions as a buffer when the I/O port IO1 is in a high level, and a data output terminal becomes in a high impedance state when the I/O port IO1 is in a low level.

In the connection as above, to the RES input terminal of the timer device 1, a signal of the same logic level (a high level or a low level) as that of an I/O port IO2 of the CPU 2 is input when the I/O port IO1 of the CPU 2 is in a high level, and a signal of the same logic level (a high level or a low level) as that of the OUT output terminal of the timer device 1 is input when the I/O port IO1 of the CPU 2 is in a low level.

Thus, the timer device 1 can be operated in the single mode by the CPU 2 setting the I/O port IO1 to be in a high level. In other words, when a start signal indicating start of measurement is input from the I/O port IO2 by setting the I/O port IO1 to be in a high level by the CPU 2, this start signal is input to the RES input terminal of the timer device 1, then the timer device 1 start measurement of a set time, and when the measurement is completed, a measurement completion signal 82 of a low level is output from the OUT output terminal. Accordingly, the OUT output terminal of the timer device 1 (in other words, the IRQ input terminal of the CPU 2) is changed from a high level to a low level, whereby the CPU 2 performs a necessary interrupt process. The timer device 1 finishes the output of the measurement completion signal 82 every time a new start signal is input from the I/O port IO2 of the CPU 2, and then performs measurement of a set time.

In this manner, it is possible to realize the single mode in which a measurement completion signal 82 (an interrupt signal of the CPU 2) of one time is generated for a start signal of one time.

On the other hand, the timer device 1 can be operated in the repeat mode in such a way that the CPU 2 sets the I/O port IO1 to be in a high level and then changes the I/O port IO1 to be in a low level after the timer device 1 is caused to start measurement of a set time. In other words, when the CPU 2 sets the I/O port IO1 to be in a high level to input a start signal indicating start of measurement from the I/O port IO2, this start signal is input to the RES input terminal of the timer device 1, and accordingly, the timer device 1 starts the measurement of the set time. Then, the CPU 2 changes the I/O port IO1 to be in a low level. When the timer device 1 finishes the measurement, a measurement completion signal 82 of a low level is output from the OUT output terminal, and thus, the CPU 2 performs a necessary interrupt process. At this moment, since the I/O port IO1 of the CPU 2 is in a low level, the measurement completion signal 82 output from the OUT output terminal of the timer device 1 is input to the RES input terminal as a restart signal. Using this restart signal, the output of the measurement completion signal 82 (interrupt signal) ends, the measurement of the set time is continued. Then, when the timer device 1 finishes second measurement, the measurement completion signal 82 is output again from the OUT output terminal, and thus, the CPU 2 performs a necessary interrupt process again. Thereafter, in the same manner, every time the measurement completion signal 82 is output from the OUT output terminal of the timer device 1, a signal is input to the RES input terminal as a next restart signal to finish the output of the measurement completion signal 82, and then the timer device 1 repeats measurement of the set time on a fixed cycle.

In this manner, it is possible to realize the repeat mode in which the measurement completion signal 82 (interrupt signal of the CPU 2) is repeatedly generated on a fixed cycle for a start signal of one time.

According to the example of FIG. 6, it is possible to freely switch the single mode and the repeat mode at an arbitrary timing by the CPU controlling operations of the tristate buffers TB1 and TB2 via the I/O port IO1.

1-3. Operation Timing of Timer Device

The timer device 1 of the embodiment is provided with the delay circuit 50 as shown in FIG. 1, and by this delay circuit 50 delaying a signal input to the RES input terminal, the pulse width of the measurement completion signal 82 (interrupt signal of the CPU 2) is sufficiently secured, and the CPU 2 can reliably recognize the generation of the interrupt signal even in the repeat mode in which the OUT output terminal is connected to the RES input terminal.

Figure 7A:
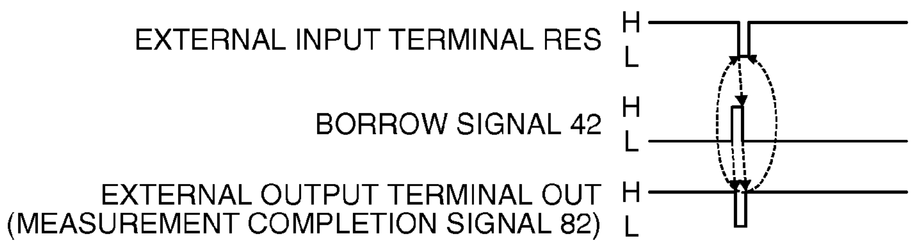
FIG. 7A is a diagram showing a generation timing of a measurement completion signal in a repeat mode when a delay circuit is not provided.
Figure 7B:
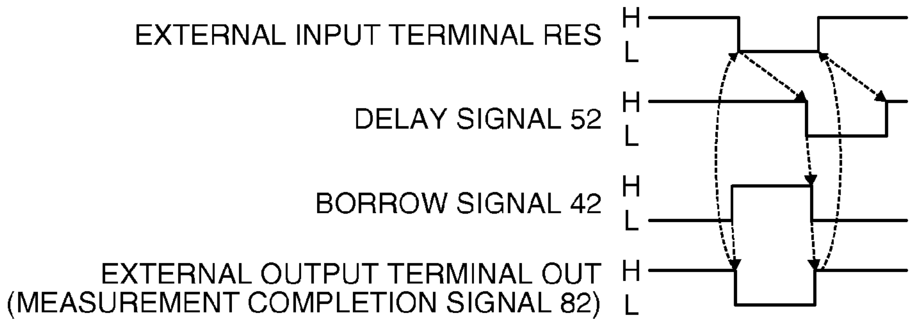
FIG. 7B is a diagram showing a generation timing of a measurement completion signal in the repeat mode of the timer device according to the embodiment.

FIG. 7A is a diagram showing a generation timing of the measurement completion signal 82 in the repeat mode of the timer device 1 when the delay circuit 50 is not provided, and FIG. 7B is a diagram showing a generation timing of the measurement completion signal 82 in the repeat mode of the timer device 1 according to the embodiment when the delay circuit 50 is provided.

As shown in FIG. 7A, when the 6-bit down counter 410 performs down-counting and the borrow signal 42 is changed from a low level to a high level, the OUT output terminal is changed from a high level to a low level receiving the signal.

When the OUT output terminal is changed from a high level to a low level, after a signal propagation delay time Td1 of a signal path from the OUT output terminal to the RES input terminal elapses, the RES input terminal is changed from a high level to a low level.

Since the delay circuit 50 is not provided, the borrow signal 42 is cleared by a signal in a low level input from the RES input terminal, instead of the delay signal 52. In other words, after the RES input terminal is changed from a high level to a low level and then a signal propagation delay time Td2 of a clear circuit elapses, the borrow signal 42 is changed from a high level to a low level.

When the borrow signal 42 is changed from a high level to a low level, the OUT output terminal is changed from a low level to a high level after a signal propagation time Td3 of the NMOS transistor 80 elapses. In this way, a low pulse of the measurement completion signal 82 is generated to the OUT output terminal of the timer device 1, but the width of the low pulse is determined to be Td1+Td2+Td3 (actually, a time of wiring delay, and the like are also added thereto), so as to be a short width of about 10 ns to 20 ns. For this reason, when the CPU 2 receives the measurement completion signal 82 (interrupt signal) via a low pass filter, the width of the measurement completion signal 82 is so short that the signal is removed by the low pass filter, and accordingly, there is a possibility that the CPU 2 is not able to recognize the interrupt signal.

With regard to this, in the timer device 1 of the embodiment, when the OUT output terminal of the timer device 1 is changed from a high level to the low level as shown in FIG. 7B, the RES input terminal is changed from a high level to a low level after the signal propagation delay time Td1 elapses, and further, the delay signal 52 output by the delay circuit 50 is changed from a high level to a low level after a predetermined delay time Td0 elapses.

When the delay signal 52 is changed from a high level to a low level, the borrow signal 42 is cleared from a high level to a low level after the signal propagation delay time Td2 elapses.

When the borrow signal 42 is changed from a high level to a low level, the OUT output terminal is changed from a low level to a high level after the signal propagation time Td3 elapses. In this way, a low pulse of the measurement completion signal 82 is generated to the OUT output terminal of the timer device 1, but the width of the low pulse is determined to be Td0+Td1+Td2+Td3 (actually, a time of wiring delay, and the like are added thereto). Thus, if the delay time Td0 of the delay circuit 50 is set to be, for example, 100 ns, the width of the low pulse of the measurement completion signal 82 becomes about 100 ns, and even when the CPU 2 receives the measurement completion signal 82 (interrupt signal) via the low pass filter, the signal is not removed by the low pass filter, and accordingly, the CPU 2 can reliably recognize the interrupt signal.

At least after power is supplied, the timer device 1 of the embodiment finishes the output of the measurement completion signal 82 (sets the OUT output terminal to be in a high level) for the start signal first input from the RES input terminal, updates the preset value stored in the preset buffer 420 according to signals input to the BX5 to BX0 input terminals, and performs an initializing process (hereinafter, referred to as an "output release & reset process") for the count value of the pre-settable down counter 40 so as to be the updated preset value stored in the preset buffer 420.

On the other hand, at least when a restart signal is input from the RES input terminal, the timer device 1 of the embodiment performs a process of finishing the output of the measurement completion signal 82 (hereinafter, referred to as an "output release process"), but does not perform updating of the preset buffer 420 and initialization of the pre-settable down counter 40.

In this way, the pre-settable down counter 40 is required to make any one of the above-described two processes be selected. As previously described, however, the timer device 1 of the embodiment uses 14 external terminals, and fully uses all pins if a 14-pin package is installed therein. For this reason, it is not possible to assign an external terminal for selecting any one of the above-described two processes. The timer device 1 of the embodiment makes it possible to select any one of the output release & reset process and the output release process by changing the width of the pulse (input time) of a signal input to the RES input terminal. Specifically, the input time determination circuit 60 of the timer device 1 determines whether the input time of a signal input to the RES input terminal is longer or shorter than a determination time (the time of one cycle of the fixed clock signal 34) that is set in advance, and when the input time is longer, the reset signal 64 is generated, and when the input time is shorter, the reset signal 64 is not generated. In addition, the pre-settable down counter 40 performs the output release & reset process by the input of the reset signal 64 and the delay signal 52 of a low level, and performs the output release process only by the input of the delay signal 52 of a low level (the reset signal 64 is not input).

Figure 8A:
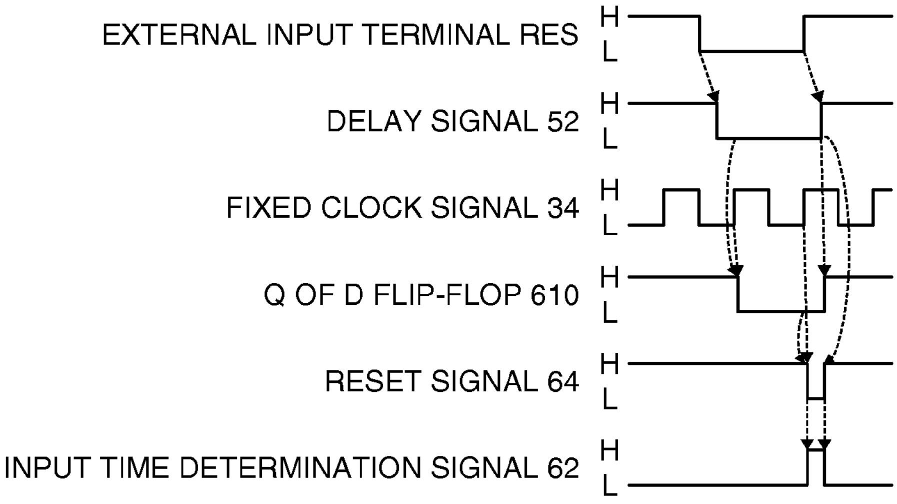
FIG. 8A is a diagram showing a timing of a process of an input time determination circuit when a signal of an input time that is longer than a determination time is input.
Figure 8B:
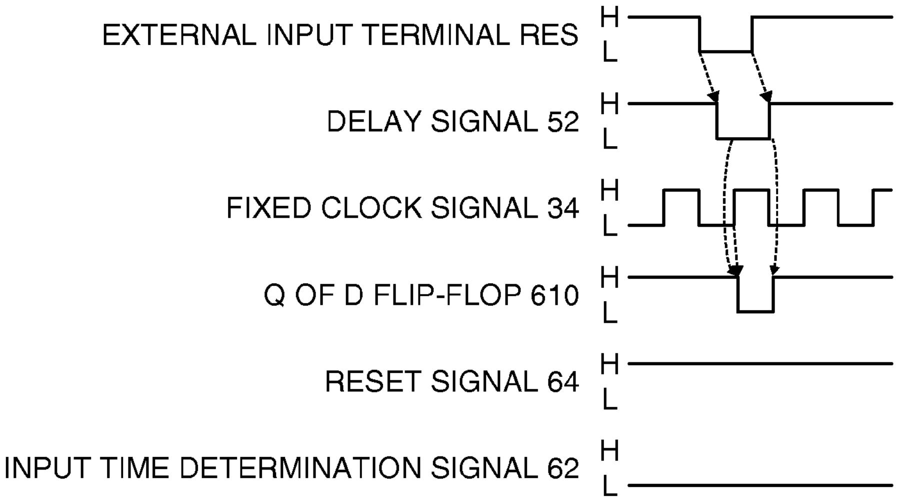
FIG. 8B is a diagram showing a timing of a process of the input time determination circuit when a signal of an input time that is shorter than the determination time is input.

FIG. 8A is a diagram showing a timing of a process of the input time determination circuit 60 when a signal of an input time that is longer than the determination time is input from the RES input terminal, and FIG. 8B is a diagram showing a timing of a process of the input time determination circuit 60 when a signal of the input time that is shorter than the determination time is input from the RES input terminal.

As shown in FIG. 8A, when the RES input terminal of the timer device 1 is changed from a high level to a low level, the delay signal 52 output by the delay circuit 50 is also changed from a high level to a low level after a predetermined delay time elapses.

When the delay signal 52 is changed from a high level to a low level, asynchronous set of the D flip-flops 610 and 620 are released, the low level of the delay signal 52 is incorporated into the D flip-flop 610 at the leading edge of the first fixed clock signal 34 after the delay signal 52 is changed from a high level to a low level, and the high level of the data output terminal (Q) of the D flip-flop 610 is incorporated into the D flip-flop 620. Accordingly, the data output terminal (Q) of the D flip-flop 610 is changed from a high level to a low level. In addition, the reset signal 64 output from the data output terminal (Q) of the D flip-flop 620 maintains to be in a high level, and the input time determination signal 62 output from the inverse data output terminal (/Q) maintains to be in a low level.

Since the delay signal 52 maintains to be in a low level to the leading edge of the next fixed clock signal 34, asynchronous sets of the D flip-flops 610 and 620 maintains to be released, the low level of the delay signal 52 is incorporated into the D flip-flop 610 at the leading edge of this fixed clock signal 34, and the low level of the data output terminal (Q) of the D flip-flop 610 is incorporated into the D flip-flop 620. Accordingly, the data output terminal (Q) of the D flip-flop 610 maintains to be in a low level. In addition, the reset signal 64 output from the data output terminal (Q) of the D flip-flop 620 is changed from a high level to a low level, and the input time determination signal 62 output from the inverse data output terminal (/Q) is changed from a low level to a high level.

In addition, when the RES input terminal is changed from a low level to a high level, the delay signal 52 output by the delay circuit 50 is also changed from a low level to a high level after a predetermined delay time elapses.

When the delay signal 52 is changed from a low level to a high level, the D flip-flops 610 and 620 are asynchronously set, and the data output terminal (Q) of the D flip-flop 610 is changed from a low level to a high level. In addition, the reset signal 64 output from the data output terminal (Q) of the D flip-flop 620 is changed from a low level to a high level, and the input time determination signal 62 output from the inverse data output terminal (/Q) is changed from a high level to a low level.

In this manner, if there are two or more of leading edges of the fixed clock signal 34 while the delay signal 52 is in a low level, a low pulse of the reset signal 64 is generated with the delay signal 52 of a low level, and thus, the pre-settable down counter 40 performs the output release & reset process.

On the other hand, as shown in FIG. 8B, when the delay signal 52 is changed from a low level to a high level in front of the second leading edge of the fixed clock signal 34 after the delay signal 52 is changed from a high level to a low level, the D flip-flops 610 and 620 are asynchronously set before the reset signal 64 is changed from a high level to a low level. For this reason, a low pulse of the reset signal 64 is not generated.

In this manner, if there are not two or more leading edges of the fixed clock signal 34 while the delay signal 52 is in the low level, the delay signal 52 of the low level is generated, but since a low pulse of the reset signal 64 is not generated, the pre-settable down counter 40 performs an output release process.

Note that the RES input terminal and the fixed clock signal 34 are in an asynchronous relation, but if the length (input time) of a low pulse of the RES input terminal is equal to or longer than two cycles of the fixed clock signal 34, two or more leading edges of the fixed clock signal 34 should be present while the RES input terminal has a low pulse. On the other hand, if the length (input time) of the low pulse of the RES input terminal is less than one cycle of the fixed clock signal 34, the number of leading edges of the fixed clock signal 34 present while the RES input terminal has the low pulse is less than or equal to one. Therefore, a specification may be set in which the minimum value of the input time in which the pre-settable down counter 40 is caused to perform the output release & reset process is defined to be a first predetermined time that is equal to or longer than two cycles of the fixed clock signal 34, the maximum value of the input time in which the pre-settable down counter 40 is caused to perform the output release process is defined to be a second predetermined time that is shorter than one cycle of the fixed clock signal 34, and an input time between the second predetermined time and the first predetermined time is forbidden.

In the embodiment, the single mode is realized by inputting a start signal of an input time that is longer than a determination time to the RES input terminal.

Figure 9:
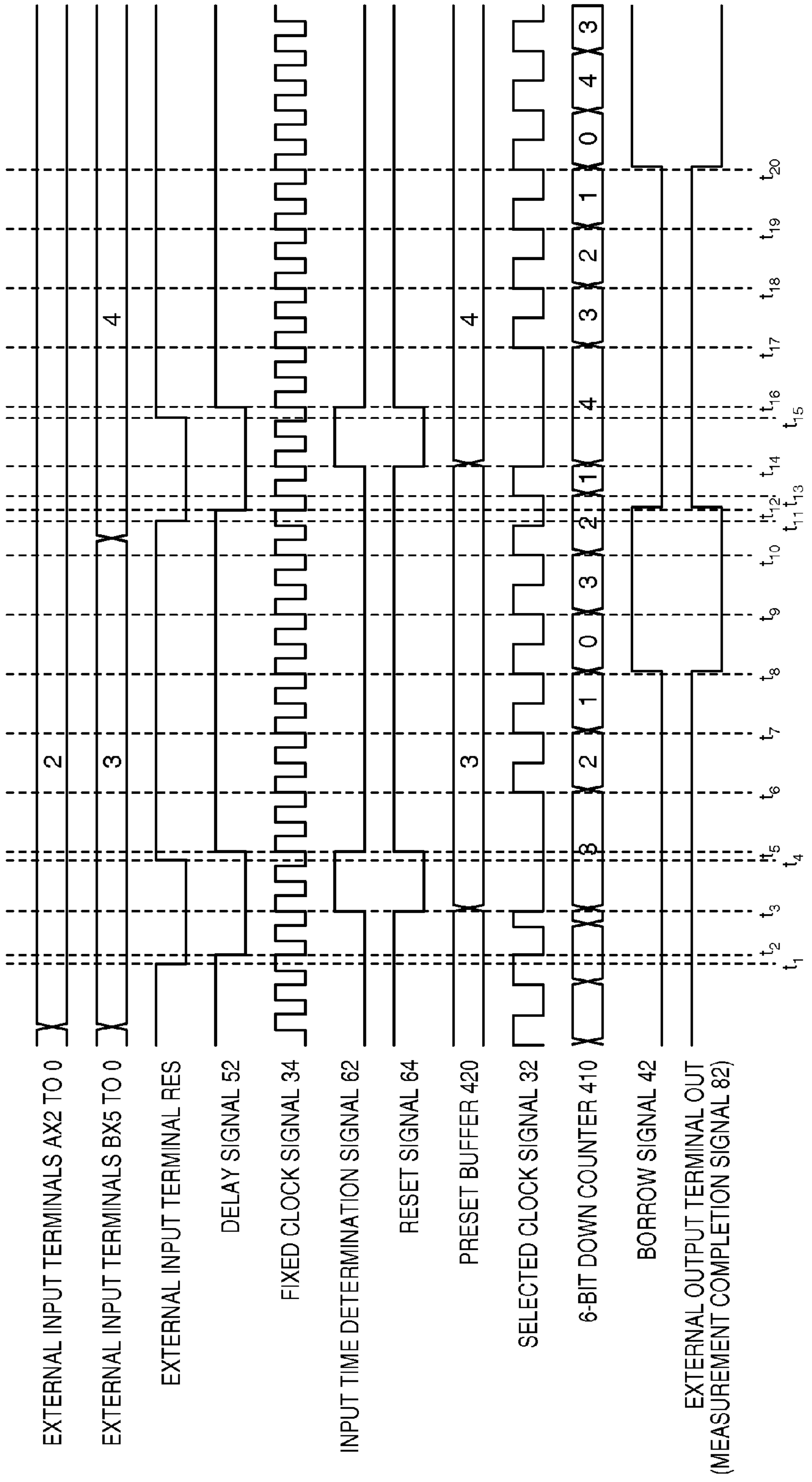
FIG. 9 is a diagram showing operation timings of the timer device in a single mode according to the embodiment.

FIG. 9 is a timing chart diagram showing operation timings of the timer device 1 in the single mode.

When a start signal from the input terminal IN (in the example of FIG. 5) or the I/O port IO2 (in the example of FIG. 6) of the CPU 2 is input at a time $t_1$ and the RES input terminal is changed from a high level to a low level, the delay signal 52 is changed from a high level to a low level at a time $t_2$ at which a predetermined delay time elapses. Accordingly, the borrow signal 42 is cleared.

When the input of the start signal is continued, and the RES input terminal maintains a low level, the delay signal 52 also accordingly maintains a low level. Then, at the timing (time $t_3$) of the second leading edge of the fixed clock signal 34 after the delay signal 52 is changed from a high level to a low level, the delay signal 52 still maintains the low level, and thus, the input time determination circuit 60 determines that the input time of the start signal is longer than the determination time. As a result, the input determination signal 62 is changed from a low level to a high level, and the reset signal 64 is changed from a high level to a low level. Since the reset signal 64 is changed from the high level to the low level at the time $t_3$, 3 of a set value of the BX5 to BX0 input terminals is stored in the preset buffer 420. In addition, the initial value of the 6-bit down counter 410 is updated to 3 of the preset value stored in the preset buffer 420. Further, the frequency division circuit 310 is reset, and the selected clock signal 32 stops.

When the input of the start signal ends and the RES input terminal is changed from a low level to a high level at a time $t_4$, the delay signal 52 is changed from a low level to a high level at a time $t_5$ at which a predetermined delay time elapses. Since the delay signal 52 is changed from a low level to a high level at the time $t_5$, the input determination signal 62 is changed from a high level to a low level, and the reset signal 64 is changed from a low level to a high level.

Since the reset signal 64 is changed from the low level to the high level at the time $t_5$, the reset of the frequency division circuit 310 is released, and a frequency-divided clock signal of the original oscillation clock signal 22 starts to be generated. Then, the selected clock signal 32 is selected by the selection circuit 320 according to 2 of a set value of the AX2 to AX0 input terminals, and then supplied to the 6-bit down counter 410.

The 6-bit down counter 410 performs down-counting in synchronization with the leading edges of the selected clock signal 32 at times $t_6$, $t_7$, and $t_8$, and the count value changes in order of 3→2→1→0. Then, in synchronization with the timing (time $t_8$) of the leading edge of the selected clock signal 32 at which the count value of the 6-bit down counter 410 becomes 0, the borrow signal 42 is changed from a low level to a high level. As a result, the OUT output terminal is changed from a high level to a low level, and the measurement completion signal 82 (the interrupt signal of the CPU 2) is output.

Note that it may be configured such that the frequency division circuit 310 causes the first leading edge of each frequency-divided clock signal when a time of one cycle of each frequency-divided clock signal elapses after reset is released at the time $t_5$. If this operation is performed, the timer device 1 can measure set times (set values of the BX5 to BX0 input terminals) without error.

Further, the 6-bit down counter 410 initializes the count value from 0 to 3 of the preset value stored in the preset buffer 420 in synchronization with the leading edge of the selected clock signal 32 at a time $t_9$. Then, the 6-bit down counter 410 performs down-counting again in synchronization with the leading edges of the selected clock signal 32 at times $t_{10}$ and $t_{13}$, and accordingly, the count value changes in order of 3→2→1.

When the start signal is input again, and the RES input terminal is changed from a high level to a low level at a time $t_{11}$, the delay signal 52 is changed from a high level to a low level at a time $t_{12}$ at which a predetermined delay time elapses. Accordingly, the borrow signal 42 is cleared so as to be changed from a high level to a low level. As a result, the OUT output terminal is changed from a low level to a high level, and accordingly, the output of the measurement completion signal 82 (interrupt signal of the CPU 2) ends.

Then, the input determination signal 62 is changed from a low level to a high level and the reset signal 64 is changed from a high level to a low level at the timing (time $t_{14}$) of the second leading edge of the fixed clock signal 34 after the delay signal 52 is changed from a high level to a low level. Since the reset signal 64 is changed from the high level to the low level at the time $t_{14}$, 4 of a set value of the BX5 to BX0 input terminals is stored in the preset buffer 420. In addition, the count value of the 6-bit down counter 410 is updated to 4 of the preset value stored in the preset buffer 420. Further, the frequency division circuit 310 is reset, and accordingly, the selected clock signal 32 is stopped.

When the input of the start signal ends and the RES input terminal is changed from a low level to a high level at a time $t_{15}$, the delay signal 52 is changed from a low level to a high level at a time $t_{16}$ at which a predetermined delay time elapses. Since the delay signal 52 is changed from the low level to the high level at the time $t_{16}$, the input determination signal 62 is changed from a high level to a low level, and the reset signal 64 is changed from a low level to a high level.

Since the reset signal 64 is changed from the low level to the high level at the time $t_{16}$, the reset of the frequency division circuit 310 is released, and a frequency-divided clock signal of the original oscillation clock signal 22 starts to be generated. Then, the selected clock signal 32 is selected by the selection circuit 320 according to 2 of the set value of the AX2 to AX0 input terminals, and then supplied to the 6-bit down counter 410.

The 6-bit down counter 410 performs down-counting in synchronization with the leading edges of the selected clock signal 32 at times $t_{17}$, $t_{18}$, $t_{19}$, and $t_{20}$, and the count value changes in order of 4→3→2→1→0. Then, in synchronization with the timing (time $t_{20}$) of the leading edge of the selected clock signal 32 at which the count value of the 6-bit down counter 410 becomes 0, the borrow signal 42 is changed from a low level to a high level. As a result, the OUT output terminal is changed from a high level to a low level, and the measurement completion signal 82 (the interrupt signal of the CPU 2) is output.

When the OUT output terminal and the RES input terminal are connected, the timer device 1 of the embodiment outputs the measurement completion signal 82 having a pulse width (for example, about 100 ns) according to a delay time of the delay circuit 50 and the measurement completion signal 82 is input to the RES input terminal as a restart signal, as described in FIG. 7B. With regard to this, since the frequency of the fixed clock signal 32 is, for example, 32.768 kHz, and the time of one cycle thereof is about 30.5 μs, an input time of the restart signal is shorter than a determination time. Thus, since the reset signal 64 is not generated in the restart signal, and the frequency division circuit 310 is not reset, the 6-bit down counter 410 continues down-counting of a preset value on a fixed cycle. Accordingly, the repeat mode is realized.

Figure 10:
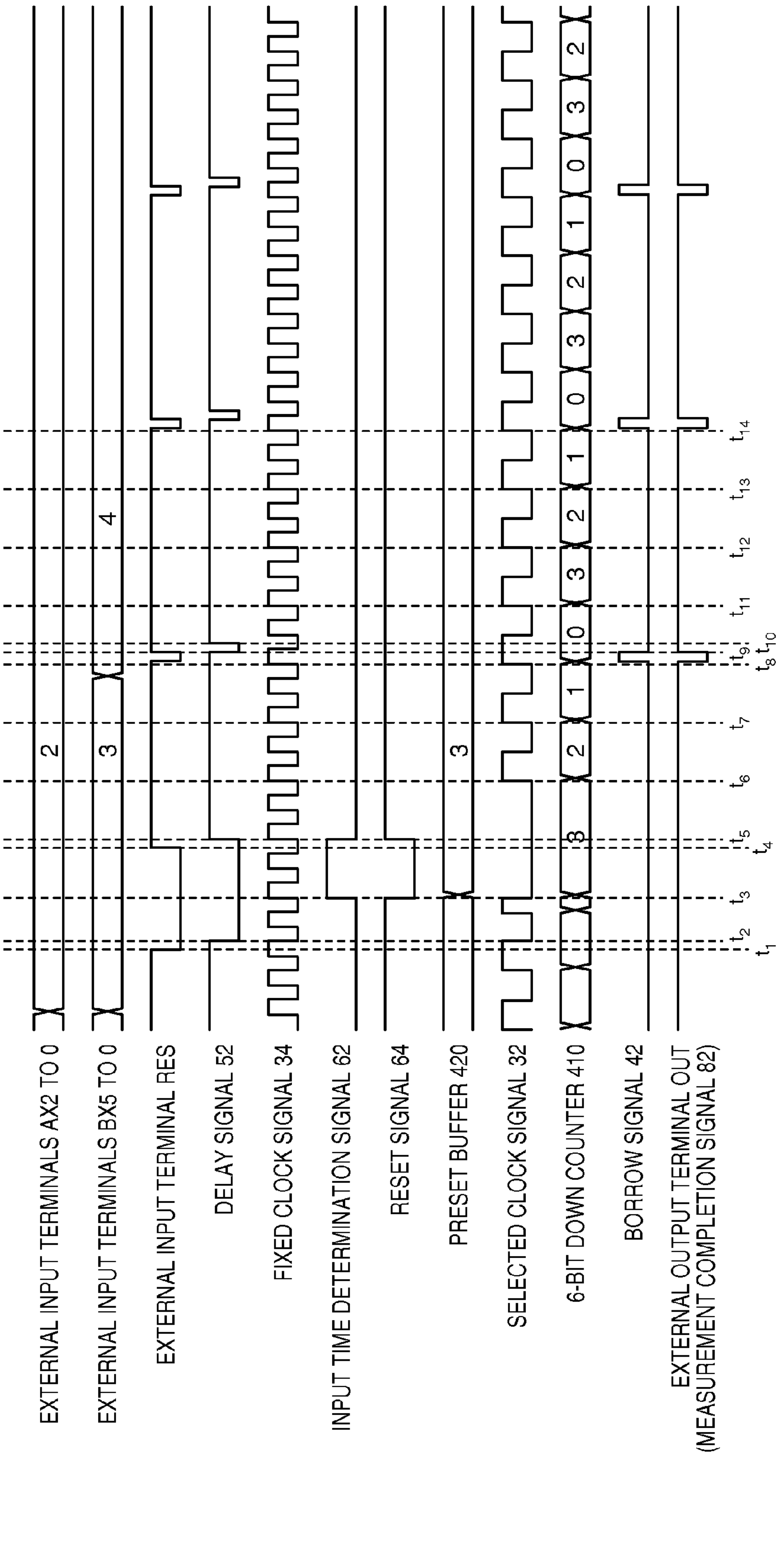
FIG. 10 is a diagram showing operation timings of the timer device in the repeat mode according to the embodiment.

FIG. 10 is a timing chart diagram showing operation timings of the timer device 1 in the repeat mode.

When a start signal from the input terminal IN (in the example of FIG. 5) or the I/O port IO2 (in the example of FIG. 6) of the CPU 2 is input at the time $t_1$ and the RES input terminal is changed from a high level to a low level, the timer device 1 measures a set time, and the OUT output terminal is changed from a high level to a low level, and then, the measurement completion signal 82 (interrupt signal of the CPU 2) is output in synchronization with the timing of the leading edge of the selected clock signal 32 at the time $t_8$. Note that the operation timings of the time $t_1$ to time $t_8$ are completely the same as those in FIG. 9, detailed description thereof will be omitted.

When the OUT output terminal is changed from a high level to a low level, the RES input terminal connected to the OUT output terminal is also changed from a high level to a low level, and the input of the restart signal is automatically started. Then, at the time $t_9$ at which a predetermined delay time elapses after the RES input terminal is changed from the high level to the low level, the delay signal 52 is changed from a high level to a low level. Accordingly, the borrow signal 42 is cleared so as to be changed from a high level to a low level. As a result, the OUT output terminal is changed from a low level to a high level, and accordingly, the output of the measurement completion signal 82 (interrupt signal of the CPU 2) ends.

When the OUT output terminal is changed from the low level to the high level at the time $t_9$, the RES input terminal is also changed from a high level to a low level, and accordingly, the input of the restart signal ends. Then, at the time $t_{10}$ at which a predetermined delay time elapses after the RES input terminal is changed from a low level to a high level, the delay signal 52 is changed from a low level to a high level. Herein, since the input of the restart signal ends in front of the timing (time $t_{11}$) of the second leading edge of the fixed clock signal 34 after the delay signal 52 is changed from a high level to a low level, the input determination signal 62 maintains the low level, and the reset signal 64 does not changes, maintaining the high level. Thus, 4 of a set value of the BX5 to BX0 input terminals is not stored in the preset buffer 420. In addition, since the frequency division circuit 310 is not reset, the selected clock signal 32 does not stop, and the 6-bit down counter 410 continues down-counting in synchronization with the leading edges of the selected clock signal 32.

Then, the 6-bit down counter 410 performs down-counting in synchronization with the leading edges of the selected clock signal 32 at the times $t_{11}$, $t_{12}$, $t_{13}$, and $t_{14}$, and the count value changes in order of 0→3→2→1→0. Then, in synchronization with the timing ($t_{14}$) of the leading edge of the selected clock signal 32 at which the count value of the 6-bit down counter 410 becomes 0, the borrow signal 42 is changed from a low level to a high level. As a result, the OUT output terminal is changed from a high level to a low level, and the measurement completion signal 82 (the interrupt signal of the CPU 2) is output.

The timer device 1 measures set times at the same timing as the times $t_8$ to $t_{14}$ at the time $t_{14}$ and thereafter, outputs the measurement completion signal 82 (interrupt signal of the CPU 2) every time the measurement ends, and repeats a process of starting measurement using this measurement completion signal 82 as the next restart signal.

As described above, the timer device of the embodiment determines the time length relationship between the input time of a signal in a low level input to the RES input terminal and a determination time corresponding to the time of one cycle of the fixed clock signal 34, and changes a counting process of the pre-setable down counter 40 according to the determination result. Therefore, according to the timer device of the embodiment, a measurement process can be changed without providing a dedicated external terminal by changing an input time of a signal in a low level input to the RES input terminal.

Particularly, according to the timer device of the embodiment, by inputting a start signal having a pulse width that is longer than a determination time from the RES input terminal, it is possible to realize the single mode in which a set time is measured from a timing at which the input of the start signal ends. In addition, by connecting the RES input terminal and the OUT output terminal, it is also possible to realize the repeat mode in which the measurement completion signal 82 having a pulse width that is shorter than a determination time is input as a next restart signal. In other words, since it is possible to select the timer device so as to be operated as a fixed cycle timer or to be operated as a general-purpose timer according to whether or not the RES input terminal is connected to the OUT output terminal, it is not necessary to separately provide an external terminal for selection.

Further, even when the timer device of the embodiment is operated as a fixed cycle timer, it is possible to secure more sufficient output time of the measurement completion signal 82 by the delay time of the delay circuit 50. Thus, since the external CPU can recognize the measurement completion signal 82 as an interrupt signal, an interrupt process can be normally performed.

In addition, according to the timer device of the embodiment, by lengthening an input time of a signal of a low level input to the RES input terminal than a determination time, a preset value of the 6-bit down counter can be updated to a set value of the BX5 to BX0 input terminals. Thus, since it is not necessary to change the preset value using a program, reliability can be enhanced.

In addition, according to the timer device of the embodiment, since a measurement time is equal to the product of a cycle of the selected clock signal 32 and a preset value, a selection range of the measurement time can be widened by selecting a frequency of the selected clock signal 32 according to set value of the AX2 to AX0 input terminals.

2. Electronic Apparatus

Figure 11:
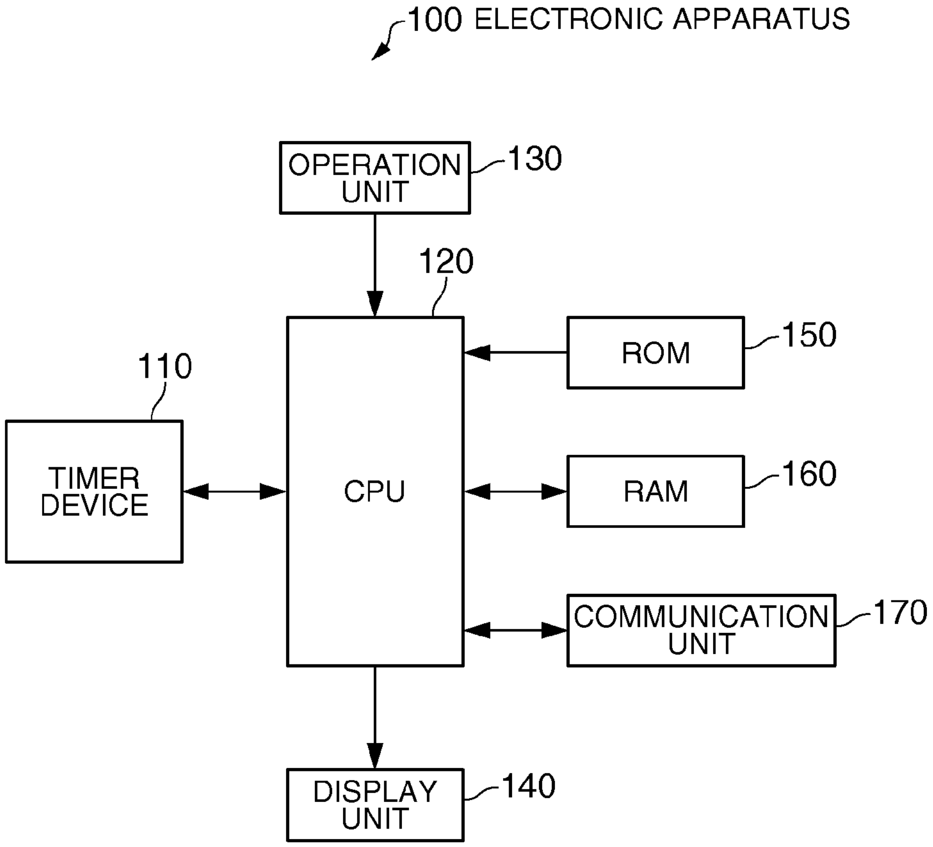
FIG. 11 is a functional block diagram of an electronic apparatus according to the embodiment.

FIG. 11 is a functional block diagram of an electronic apparatus according to the embodiment. The electronic apparatus 100 of the embodiment is configured to include a timer device 110, a CPU 120, an operation unit 130, a display unit 140, a ROM (Read Only Memory) 150, a RAM (Random Access Memory) 160, and a communication unit 170. Note that, the electronic apparatus of the embodiment may be configured that some of the constituent elements (each of units) of FIG. 11 is omitted or changed, or other constituent elements are added thereto.

The timer device 110 measures a set time and generates a timer completion signal when the measurement ends.

The CPU 120 performs various calculation processes and control processes according to a program stored in the ROM 150, or the like. Specifically, the CPU 120 receives a measurement completion signal from the timer device 110 or performs a predetermined calculation process. The CPU 120 may cause the timer device 110 to transmit a start signal or a restart signal, or may perform various kinds of control over the timer device 110. In addition, the CPU 120 performs various processes according to operation signals of the operation unit 130, a process of transmitting a display signal for causing the display unit 140 to display various kinds of information, and a process of controlling the communication unit 170 to perform data communication with the outside.

The operation unit 130 is an input device including operation keys, button switches, and the like, and outputs operation signals to the CPU 120 in accordance with operations of a user.

The display unit 140 is a display device including an LCD (Liquid Crystal Display), or the like, and displays various kinds of information based on display signals input from the CPU 120.

The ROM 150 stores programs, data, and the like for causing the CPU 120 to perform various calculation and control processes.

The RAM 160 is used as a work area of the CPU 120, and temporarily stores programs or data read from the ROM 150, data input from the operation unit 130, calculation results executed by the CPU 120 according to various programs, and the like.

The communication unit 170 performs various kinds of control for achieving data communication between the CPU 120 and an external device.

It is possible to realize low cost while maintaining high reliability by incorporating the timer device 1 of the embodiment into the electronic apparatus 100 as the timer device 110.

As the electronic apparatus 100, various electronic apparatuses using the timer device are considered, and for example, a real-time clock device, a personal computer (for example, a mobile-type personal computer, a lap-top-type personal computer, or a tablet-type personal computer), a mobile terminal such as a mobile telephone, a digital still camera, an ink jet type emission device (for example, an ink jet printer), a storage area network device such as a router, or a switch, a local area network device, a television, a video camera, a video tape recorder, a car navigation system, a pager, an electronic organizer (including one with a communication function), an electronic dictionary, a calculator, an electronic game device, a game controller, a word processor, a work station, a video telephone, a security television monitor, an electronic binocular, a POS terminal, a medical device (for example, an electronic thermometer, a sphygmometer, a blood sugar meter, an electro-cardiographic device, an ultrasonic diagnosis device, or an electronic endoscope), a fishfinder, various measurement devices, meters and gauges (for example, meters and gauges of a vehicle, aircraft, and vessels), a flight simulator, a head-mount display, a motion trace, a motion tracking, a motion controller, a PDR (Pedestrian Dead Reckoning), or the like is exemplified.

Note that the invention is not limited to the embodiment, and can be variously modified within a scope of the gist of the invention.

For example, in the embodiment, the pre-settable down counter 40 is exemplified as an example of the "counting circuit" according to the invention, and the "counting circuit" according to the invention may be an up-counter, or the like.

In addition, in the embodiment, for example, the clock generation circuit 30 generates a plurality of frequency-divided clock signal kinds by dividing the frequency of the original oscillation clock signal 22 using the frequency division circuit 310, but instead of or together with the frequency division circuit 310, a multiplier circuit may be provided so as to multiply the original oscillation clock signal 22 and generate a plurality of multiplied clock signal kinds using the multiplier circuit. Then, modification may also be performed such that any one of the plurality of multiplied clock signal kinds is selected as the selected clock signal 32 by the selection circuit 320.

In addition, in the embodiment, for example, the input time determination circuit 60 compares an input time to a fixed determination time based on the fixed clock signal 34 of a fixed frequency, but may be modified, for example, to be able to variably set the determination time according to set values of an external terminal or an internal register.

In addition, in the embodiment, for example, the repeat mode is realized by connecting the OUT output terminal and the RES input terminal of the timer device 1, but the repeat mode can even be realized without connecting the OUT output terminal to the RES input terminal, if a signal having a low pulse that is shorter than a determination time is set to be input to the RES input terminal every time the CPU receives the measurement completion signal 82 as an interrupt signal.

The invention includes substantially the same configuration (for example, a configuration having the same functions, methods, and results, or a configuration having the same objectives and effects) as the configuration described in the embodiment. In addition, the invention includes a configuration attained by replacing a portion of the configuration described in the embodiment that is not fundamental. In addition, the invention includes a configuration that exhibits the same effects or that achieves the same objectives as those of the configuration described in the embodiment. In addition, the invention includes a configuration obtained by adding a technology of the related art to the configuration described in the embodiment.

The entire disclosure of Japanese Patent Application No. 2011-266124, filed Dec. 5, 2011 is expressly incorporated by reference herein.

What is claimed is:

1. A timer device comprising:

a first external terminal;

a second external terminal;

a delay circuit that delays a signal input to the first external terminal;

a counting circuit that counts a given set value, and when counting of the set value is completed, outputs a measurement completion signal via the second external terminal, and an input time determination circuit that determines the time length relationship between an input time of the signal input and a given determination time based on a signal obtained by delaying the signal input by the delay circuit, wherein, when the input signal is input to the first external terminal after an output of the measurement completion signal, the counting circuit completes the output of the measurement completion signal based on a signal obtained by delaying the signal input by the delay circuit, the counting circuit newly counts the give set value every time counting of the give set value is completed; and the counting circuit selects whether or not a count value is to be initialized according to the determination result of the input time determination circuit.

2. The timer device according to claim 1, further comprising:

third to n-th (n≥3) external terminals, wherein the counting circuit includes a buffer in which the set value is stored, and selects whether or not the set value stored in the buffer is to be updated to a set value according to a signal input to the third to n-th external terminals in accordance with the determination result of the input time determination circuit.

3. The timer device according to claim 1, wherein, by setting the time of a predetermined cycle of a first clock signal as the determination time, the input time determination circuit determines the time length relationship between the input time of the signal input and the determination time.

4. The timer device according to claim 1, further comprising:

(n+1)-th to m-th (m≥n+1) external terminals, wherein the counting circuit counts the set value based on a second clock signal of a frequency according to a signal input to the (n+1)-th to m-th external terminals.

5. An electronic apparatus including the timer device according to claim 1.

6. An electronic apparatus including the timer device according to claim 1.

7. An electronic apparatus including the timer device according to claim 2.

* * * * *